(12) United States Patent
Wu et al.

(10) Patent No.: US 7,903,424 B2
(45) Date of Patent: Mar. 8, 2011

(54) FLEXIBLE PRINTED CIRCUIT BOARD HOLDER

(75) Inventors: Cheng-Bin Wu, Shenzhen (CN); Ching-Hung Pi, Taoyuan (TW)

(73) Assignees: FuKui Precision Component (Shenzhen) Co., Ltd., Shenzhen, Guangdong Province (CN); Foxconn Advanced Technology Inc., Tayuan, Taoyuan (TW)

( * ) Notice: Subject to any disclaimer, the term of this patent is extended or adjusted under 35 U.S.C. 154(b) by 663 days.

(21) Appl. No.: 11/967,000

(22) Filed: Dec. 29, 2007

(65) Prior Publication Data

US 2009/0001641 A1   Jan. 1, 2009

(30) Foreign Application Priority Data

Jun. 29, 2007   (CN) .......................... 2007 1 0076260

(51) Int. Cl.
*H05K 5/00* (2006.01)
(52) U.S. Cl. .......................... 361/759; 361/803; 361/810
(58) Field of Classification Search ............ 361/679.01, 361/748, 784, 785, 790, 759, 803, 807, 810; 174/68.1, 250, 254, 255, 261; 439/329, 296, 439/492–495, 55, 67, 78; 211/13.1, 41.1, 41.17; 310/238, 239, 242

See application file for complete search history.

(56) References Cited

U.S. PATENT DOCUMENTS

| 5,999,074 | A  | * | 12/1999 | Coleman et al. | 335/285 |
| 6,542,372 | B1 | * | 4/2003  | Paquin et al.  | 361/758 |
| 7,246,384 | B2 | * | 7/2007  | Bentz          | 2/421   |
| 7,466,562 | B2 | * | 12/2008 | Gilliland et al. | 361/803 |
| 7,523,527 | B2 | * | 4/2009  | Garber         | 24/303  |
| 2006/0138293 | A1 | * | 6/2006 | Clement       | 248/206.5 |

FOREIGN PATENT DOCUMENTS

| CN | 2670382 Y | 1/2005 |
| CN | 2875010 Y | 2/2007 |

* cited by examiner

*Primary Examiner* — Hung S Bui
(74) *Attorney, Agent, or Firm* — Jeffrey T. Knapp

(57) ABSTRACT

In one embodiment, a holder for holding a flexible printed circuit board includes a main body and at least one securing member. The main body includes a hook portion and a holding member, wherein one of the securing member and the holding member comprises at least one magnet, and the other comprises at least one magnetic portion, at least one magnet or combination thereof such that the securing member capable of being magnetically attached to the holding member.

9 Claims, 10 Drawing Sheets

FLEXIBLE PRINTED CIRCUIT BOARD HOLDER

BACKGROUND

1. Technical Field

The present invention relates to a holder for holding a flexible printed circuit board, particularly to a holder used in a plating process.

2. Discussion of Related Art

Flexible printed circuit boards (FPCB) have been widely used in electronic products such as mobile phones, printing heads of printers and hard disks. In these electronic products, some electric components including movable modules (such as printing heads for printers) may move relative to other parts and are advantageously connected to a main body via flexible printed circuit boards. FPCB can assure power supply and signal transmission in such environment applications due to their excellent flexibility.

Usually, a number of golden fingers are formed on a flexible printed circuit board for providing reliable electrical interconnection between the FPCB and electronic components. Typically, the golden fingers are comprised of a Ni nickel layer and a gold layer formed on the Ni nickel layer.

A typical process for forming golden fingers includes plating. Generally, in order to improve their flexibility, FPCBs are made very thin and pliable. As such, FPCBs are likely to deform during plating process. Therefore, rivets are conventionally used to fixed FPCBs on a metal plate. After golden fingers are plated on the FPCB, the rivets are cut off and discarded as useless items. However, the conventional process is time-consuming and, furthermore, it is a waste of rivets.

Therefore, there is a desire to develop a reliable and recyclable tool for holding a flexible printed circuit board in a plating process.

SUMMARY OF THEN INVENTION

This and other features and advantages of the present invention as well as the preferred embodiments thereof and a holder for holding a FPCB in accordance with the invention will become apparent from the following detailed description and the descriptions of the drawings.

In one embodiment, a flexible printed circuit board holder for suspending a flexible printed circuit board having a securing hole is provided. The flexible printed circuit board holder includes a hook portion for hanging from a support bar, the hook portion having a stem; and a magnetic assembly including a holding member connected with the stem, the holding member having a protrusion for extension through the securing hole, and a securing member configured for magnetic attachment to the holding member, thus removably securing the flexible printed circuit board to the magnetic assembly.

In another embodiment, a flexible printed circuit board holder includes an electrically conductive hook portion for hanging from a support bar, the hook portion having a stem; and a magnetic assembly including a holding member connected with the stem, the holding member having a number of electrically conductive protrusions for extension through the respective securing holes of the flexible printed circuit board, a number of electrically conductive wires for establishing electrically conductive connection between the hook portion and the protrusions, and a securing member configured for magnetic attachment to the holding member, thus removably securing the flexible printed circuit board to the magnetic assembly.

BRIEF DESCRIPTION OF THE DRAWINGS

Many aspects of the present invention can be better understood with reference to the following drawings. The components in the drawings are not necessarily drawn to scale, the emphasis instead being placed upon clearly illustrating the principles of the present invention.

DETAILED DESCRIPTION OF THE PREFERRED EMBODIMENTS

Figure 1:
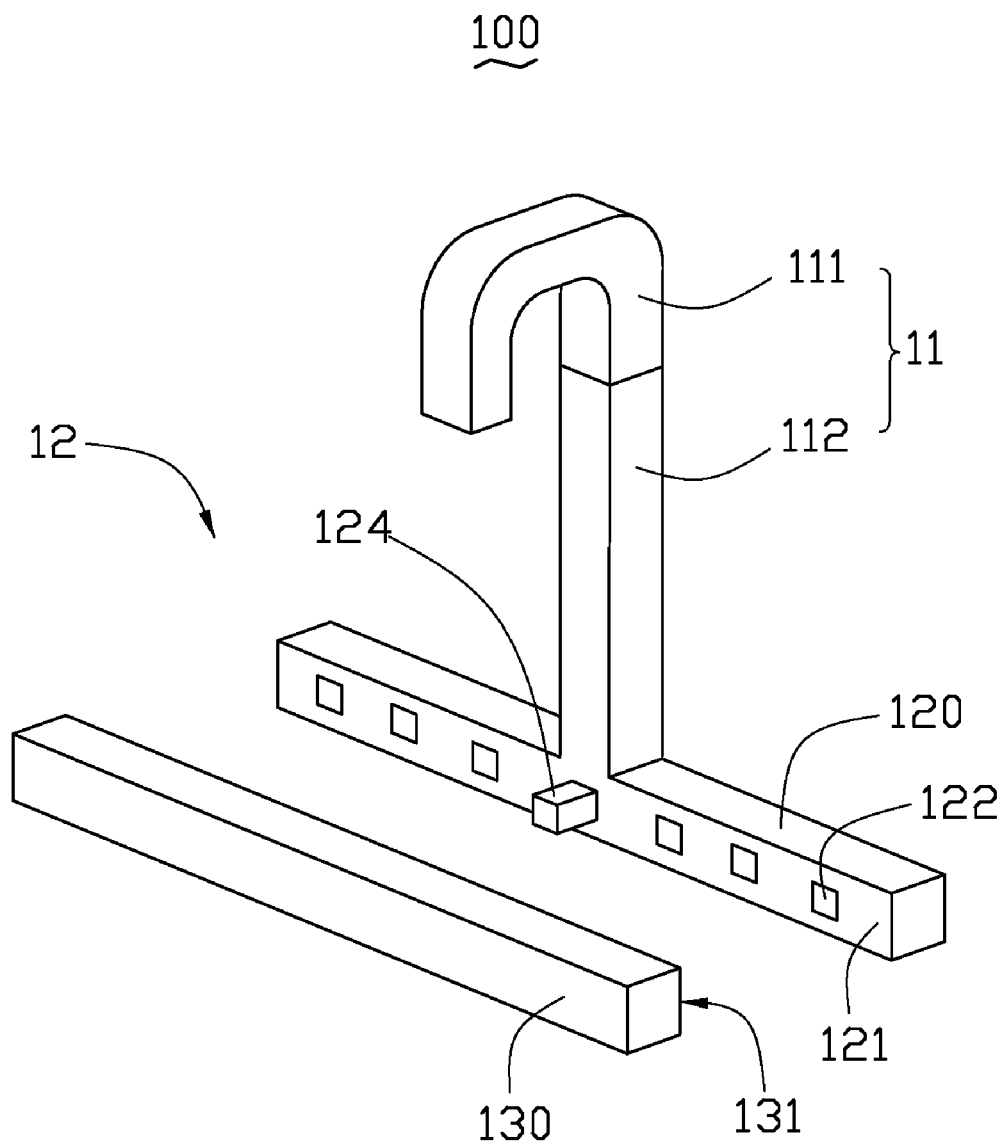
FIG. 1 is a schematic, exploded view of a holder in accordance with a first embodiment.

Referring to FIG. 1, a holder 100 in accordance with a first embodiment includes a hanging member 11 and a magnetic assembly 12. The hanging member 11 includes a hook portion 111 and a stem 112. The magnetic assembly 12 includes a holding member 120 and a securing member 130. The holding member 120 has a flat surface 121. A protrusion 124 perpendicularly extends from the flat surface 121. The securing member 130 has a flat surface 131 opposite to the flat surface 121.

The hook portion 111 is made into an inverted "U" shaped structure such that the hook portion 111 can be hanged on a support bar 150 (see FIG. 3) such as a rod or a wire. The stem 112 is connected to a middle portion of the holding member 120. In other words, the holding member 120 extends from the stem 112 toward two opposite directions. Preferably, the hook portion 111, the holding member 120 and the protrusion 124 are electrically conductive. For example, the hook portion 111, the holding member 120 and the protrusion 124 can be made of electrically conductive materials such as metals or metallic alloys. In this embodiment, the holding member 120 is perpendicular to the stem 112.

The securing member 130 is capable of being magnetically attached to the holding member 120. For example, one of the holding member 120 and the securing member 130 includes at least one magnet, and the other includes at least one magnetic portion or at least one magnet or combination thereof.

In this embodiment, the holding member 120 includes a number of magnets 122 embedded therein. The magnets 122 can be made of hard magnetic materials such as rare-earth permanent magnetic materials, metal permanent magnetic materials, or ferrite magnetic materials. Examples of rare-earth permanent magnetic materials include Nd—Fe—B magnetic materials and Sm—Co magnetic materials. Examples of metal permanent magnetic materials include AlNiCo magnetic materials and FeCrCo magnetic materials. Examples of ferrite magnetic materials include $Fe_2O_3$, $BaFe_{12}O_{19}$ and $SrFe_{12}O_{19}$. The securing member 130 can be made of soft magnetic materials such as iron, steel, cobalt, nickel, Fi—Si soft magnetic materials, Fe—Ni soft magnetic materials etc. In the present embodiment, the securing member 130 is made of cast iron having a relative permeability in the range from 200 to 400.

Figure 2:
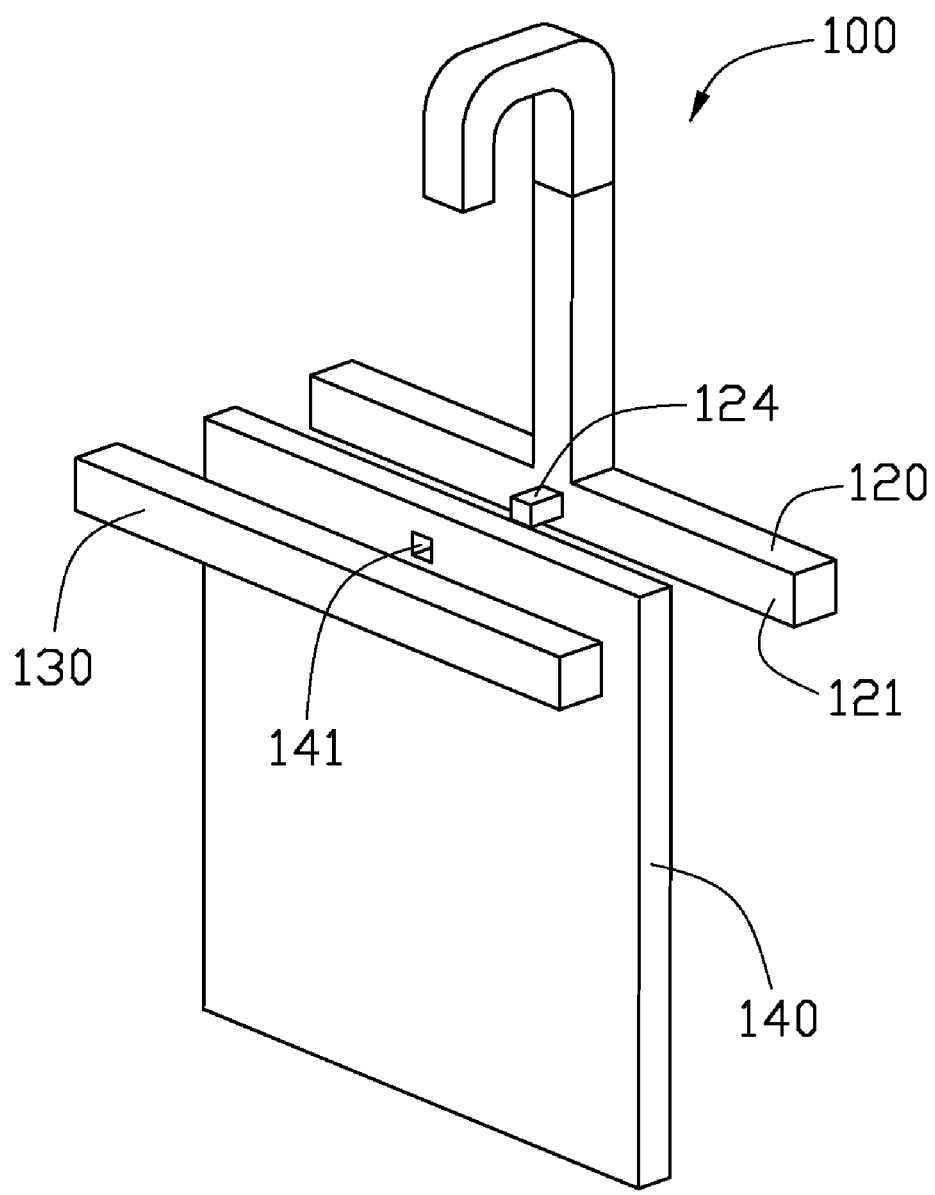
FIG. 2 is a schematic, exploded view of a flexible printed circuit board and the holder of the FIG. 1.
Figure 3:
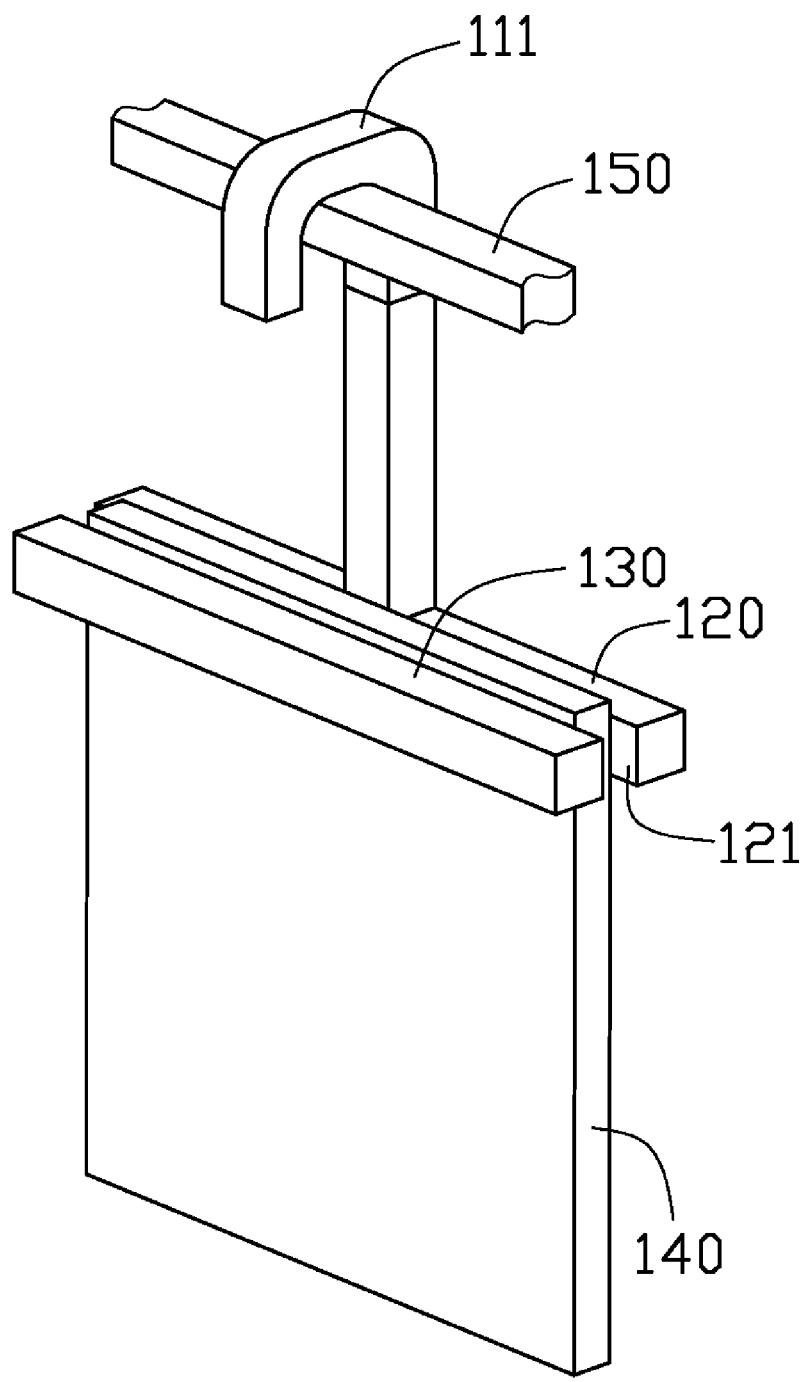
FIG. 3 is similar to FIG. 2, but shows the flexible printed circuit board being held by the holder.

FIGS. 2 and 3 are schematic views show that a flexible printed circuit board 140 being held by the holder 100. A flexible printed circuit board 130 includes a securing hole 141 defined therein. The size of the protrusion 124 is smaller than that of the securing hole 141 thus allows the protrusion 124 to insert and pass through the securing hole 141. Referring to FIG. 3, the securing member 120 is magnetically attached to the holding member 120 thereby the flexible printed circuit board 140 is clamped between the flat surface 131 of the securing member 130 and the flat surface 121 of the holding member 120. Because the flexible printed circuit board 140 is clamped between two flat surfaces 121 and 131, there are no puncture formed on the flexible printed circuit board, in other words the flexible printed circuit board is protected.

The hook portion 111 of the hanging member 11 is hanged on a support bar 150. The support bar 150 is made of electrically conductive materials thus an electric current can be applied on the support bar 150. The hook portion 111, the holding member 120 and the protrusion 124 are electrically conductive, therefore an electric current generated from a power supply can be conducted into conductive layers in the flexible printed circuit board 140 such that golden fingers can be formed by plating on the conductive layers.

Figure 4:
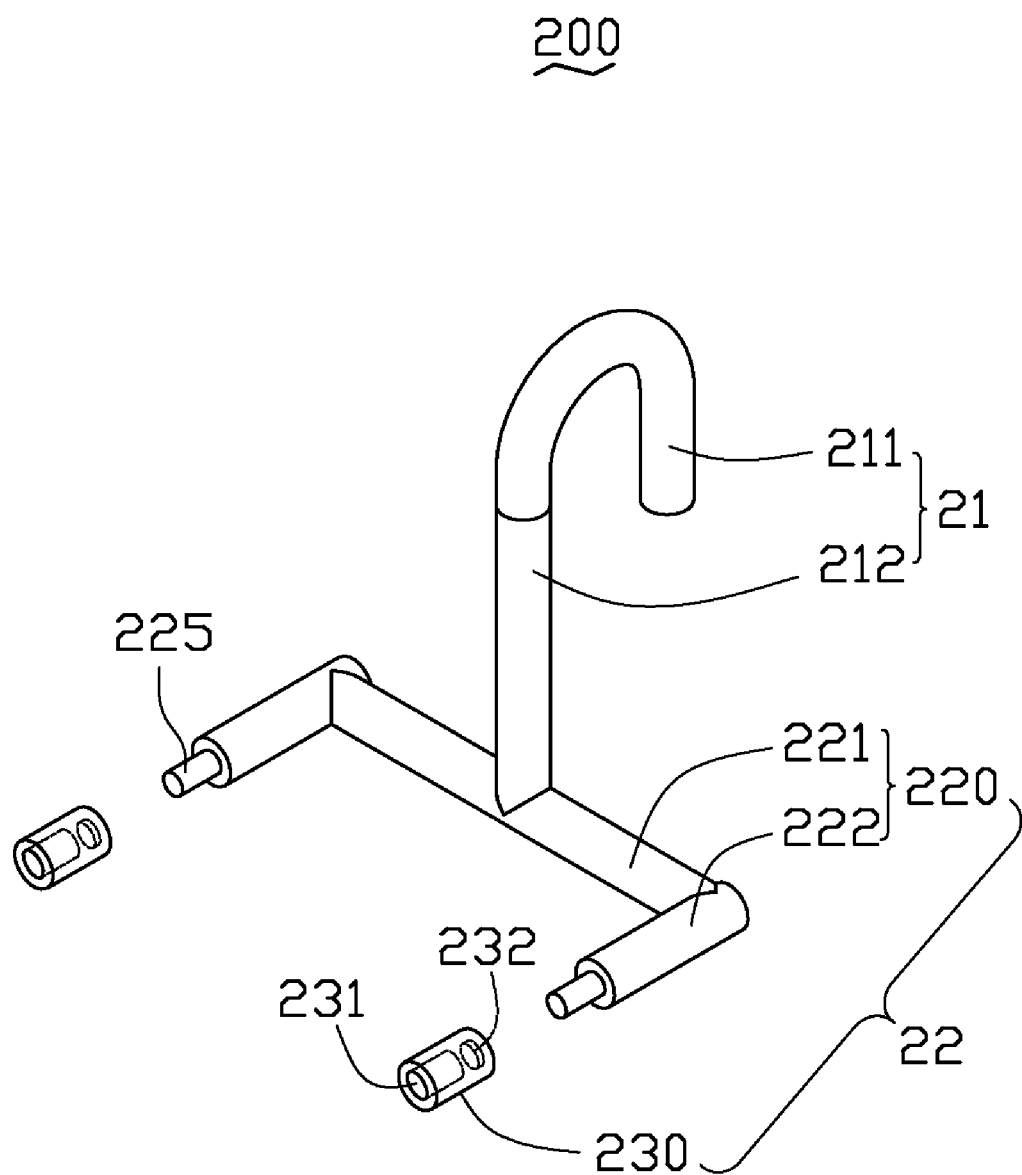
FIG. 4 is a schematic, exploded view of a holder in accordance with a second embodiment.

Referring to FIG. 4, a holder 200 for holding a flexible printed circuit board in accordance with a second embodiment includes a hanging member 21 and a magnetic assembly 22. The hanging member 21 includes a hook portion 211 and a stem 212. The hook portion 211 has similar structure to the hook portions 111 of the first embodiment. The magnetic assembly 22 includes a holding member 220 and two securing members 230. The holding member 220 includes an arm 221 and two holding units 222. The stem 212 is fixed to a middle portion of the arm 221. In other words, the arm 221 extends from the stem 212 toward two opposite directions. The two holding units 222 extend from the two distal ends of the arm 221 respectively in a same direction. A cylinder shaped protrusion 225 is formed on an end of the holding unit 222 away from the arm 221. A diameter of the protrusion 225 is less than that of the holding unit 222. The protrusion 225 is made of magnetic materials.

The securing member 230 includes a magnet 231 embedded therein and a groove 232 defined therein. The groove 232 is cylinder shaped and a diameter of the groove 232 is larger than that of the protrusion 225 such that an end of the protrusion 225 can be received in the groove 232. Preferably, the protrusion 225 has a length equal to a sum of a depth of the groove 232 and a thickness of a flexible printed circuit board to be secured on the holder 200. In this embodiment, the holder 200 can be used to hold a flexible printed circuit board including two securing holes corresponding to the two protrusions 225 preformed therein.

Figure 5:
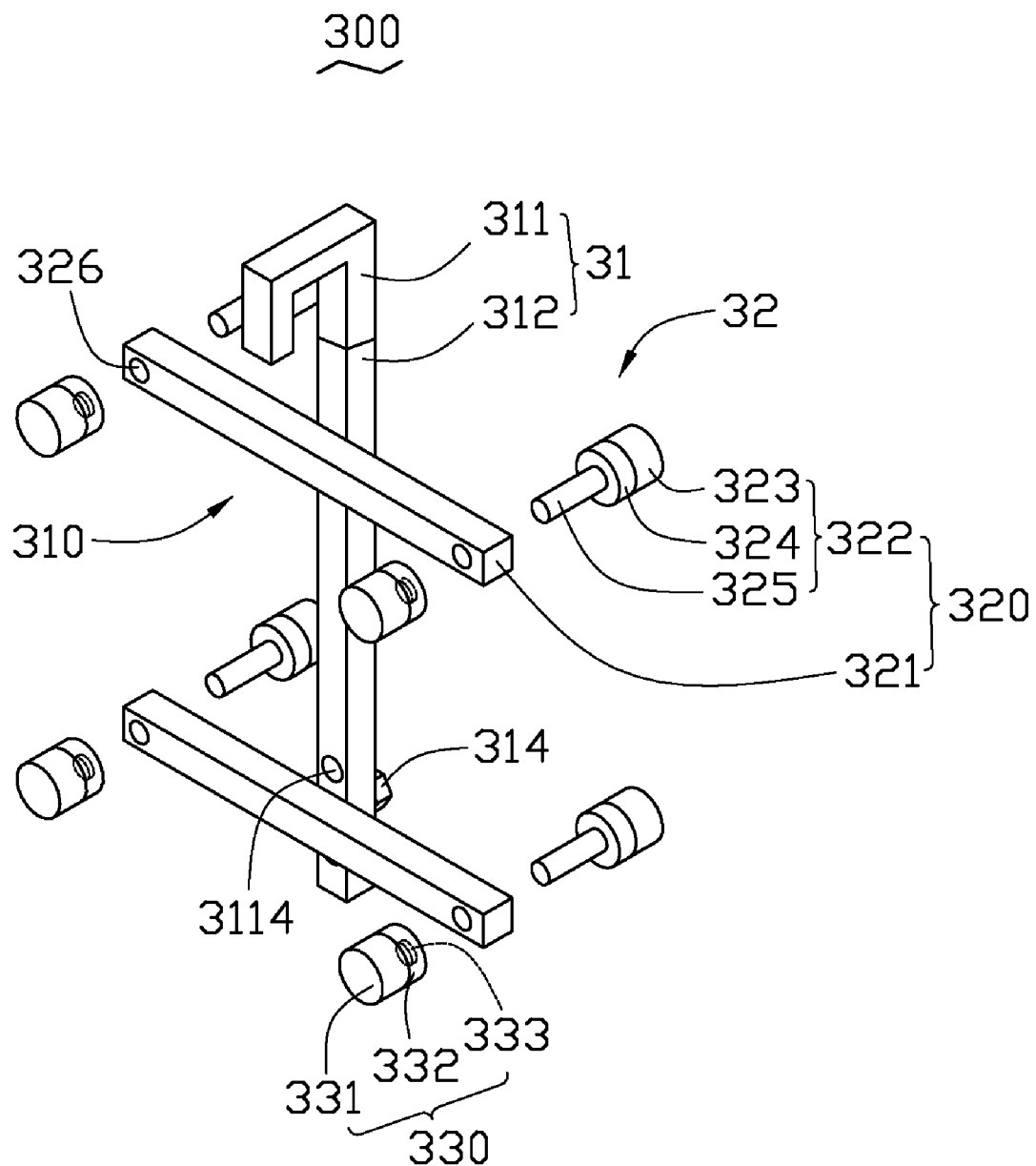
FIG. 5 is a schematic, exploded view of a holder in accordance with a third embodiment.

Referring to FIG. 5, a holder 300 for holding a flexible printed circuit board in accordance with a third embodiment includes a hanging member 31 and a magnetic assembly 32. The hanging member 31 includes a hook portion 311 and a stem 312. The magnetic assembly includes two holding members 320 and four securing members 330. Each holding member 320 includes an arm 321 and two holding units 322. Each arm 321 is fixed to the stem 312 of the hook portion 31. Preferably, the two arms 321 are parallel with each other. Each arm 321 includes two through holes 326 respectively formed in two ends thereof. Each holding unit 322 includes a base 323, a magnetic portion 324 formed on the base 323 and a protrusion 325 formed on the magnetic portion 324. The magnetic portion 324 is made of magnetic materials. The protrusion 325 is cylinder shaped. The diameter of the protrusion 325 is less than that of the through hole 326. The protrusion 325 can be received in the through hole 326 such that the holding unit 322 is detachably assembled on the arm 321. The protrusion 325 can be made of electrically conductive materials such as copper, aluminum or iron.

Each securing member 330 includes a base 331 and a magnet 332 formed on the base 331. A cylinder shaped groove 333 is formed in the magnet 332. The diameter of the groove 333 is larger than that of the protrusion 325.

A number of screw holes 313 are defined in the stem 312 of the hanging member 31. A screw 314 is threadly engaged with one of the screw holes 313. The screw 314 is used to fix one of the arms 321 on the stem 312 of the hanging member 31. A distance between the two arms 321 is adjustable by selectively securing one of the arms 321 in a desired screw holes 313.

Figure 6:
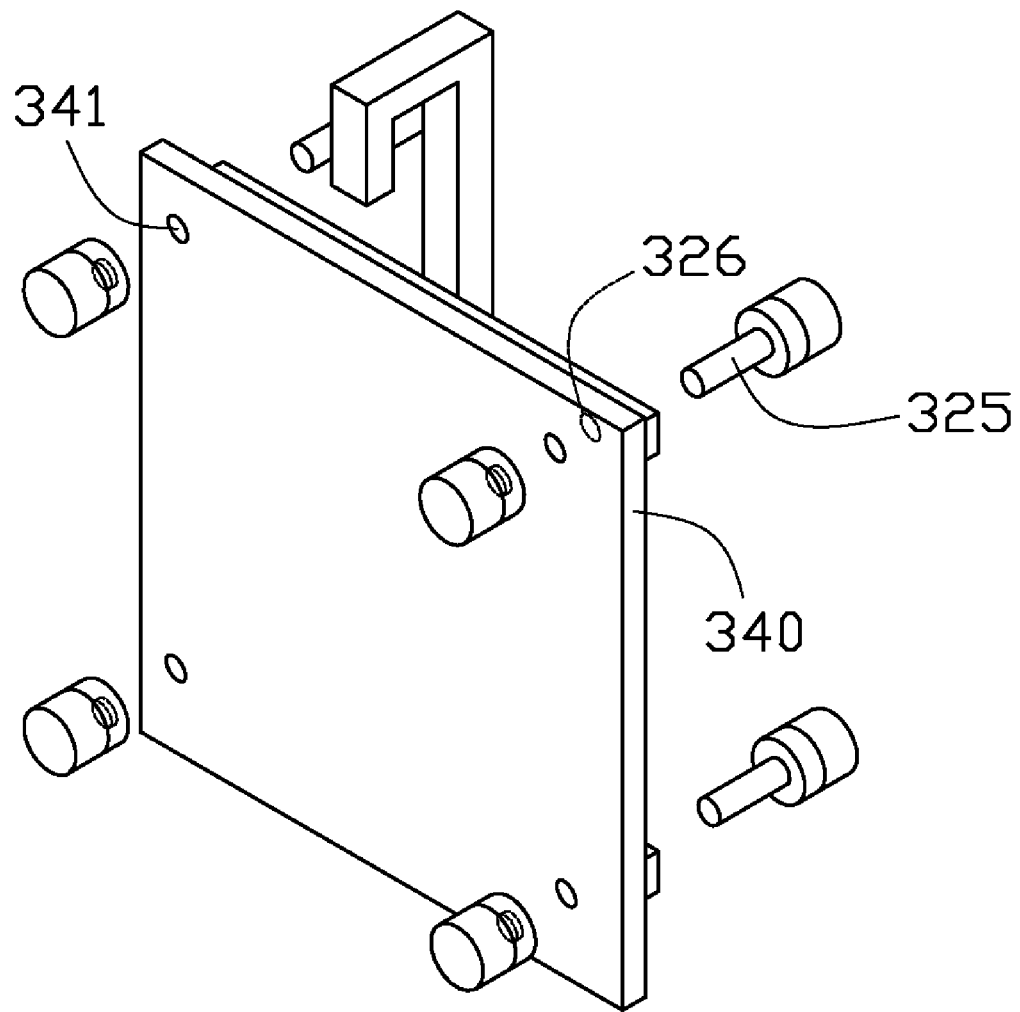
FIG. 6 is a schematic, exploded view of a flexible printed circuit board and the holder of the FIG. 5.
Figure 7:
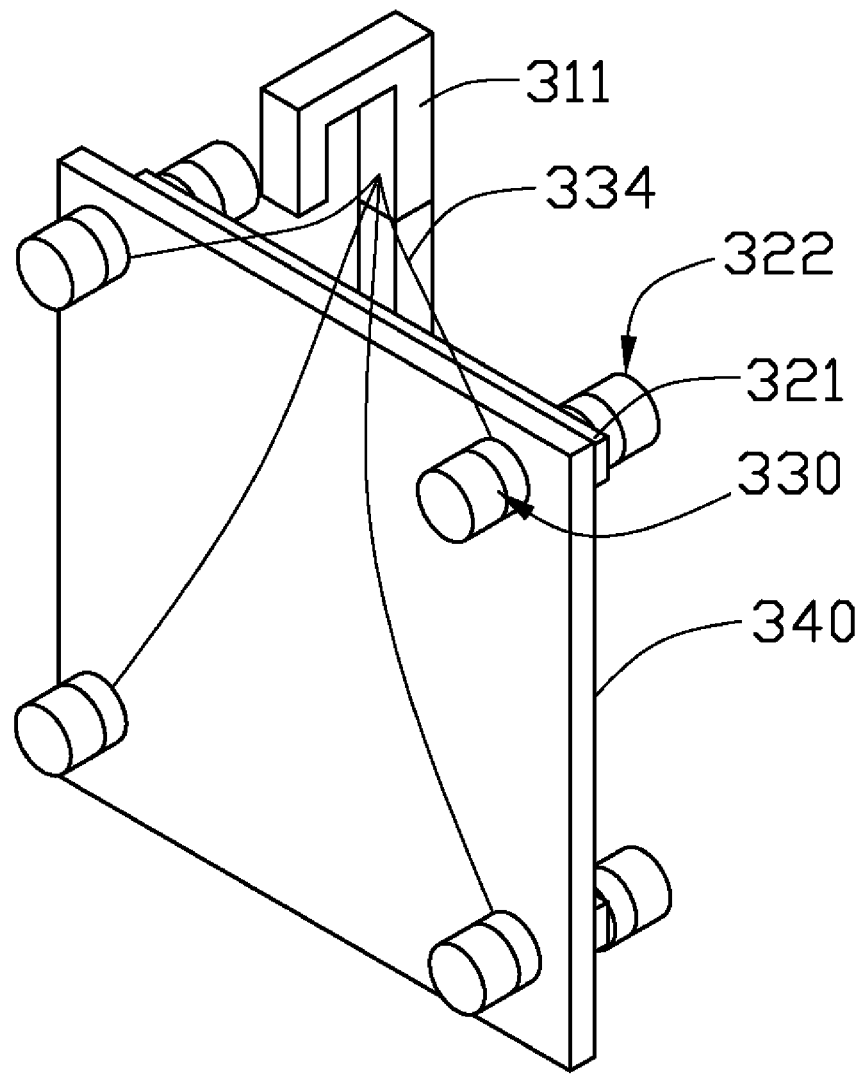
FIG. 7 is similar to FIG. 6 but shows the flexible printed circuit board being held by the holder.

FIGS. 6 and 7 show a flexible printed circuit board 340 being held using the holder 300. The flexible printed circuit board 340 includes four securing holes 341 formed therein. Each securing hole 341 is aligned with a corresponding through hole 326. A diameter of the securing hole 341 is larger or equal to a diameter of the protrusion 325. The protrusion 325 passes through the through hole 326 of the arm 321 and the securing hole 341 of the flexible printed circuit board. The holding unit 322 is assembled on the arm 321 and an end of the protrusion 325 is received in the groove 333. The securing member 330 is magnetically attached to the holding unit 322. The flexible printed circuit board 340 is clamped between the securing member 330 and the arm 321.

In this embodiment, four electrical wires 334 are used to electrically connect the four protrusions 325 to the hook 311 respectively. The electrical wire 334 can be made of metal having high electrical conductivity such as copper or aluminum. The four electrical wires 334 can assure that electric potential of the four protrusions 325 are at a same level. Therefore, a electric potential distribution in a conductive layer of the flexible printed circuit board 340 is very uniform. As a result, a uniform plated layer can be formed on the conductive layer of the flexible printed circuit board.

Figure 8:
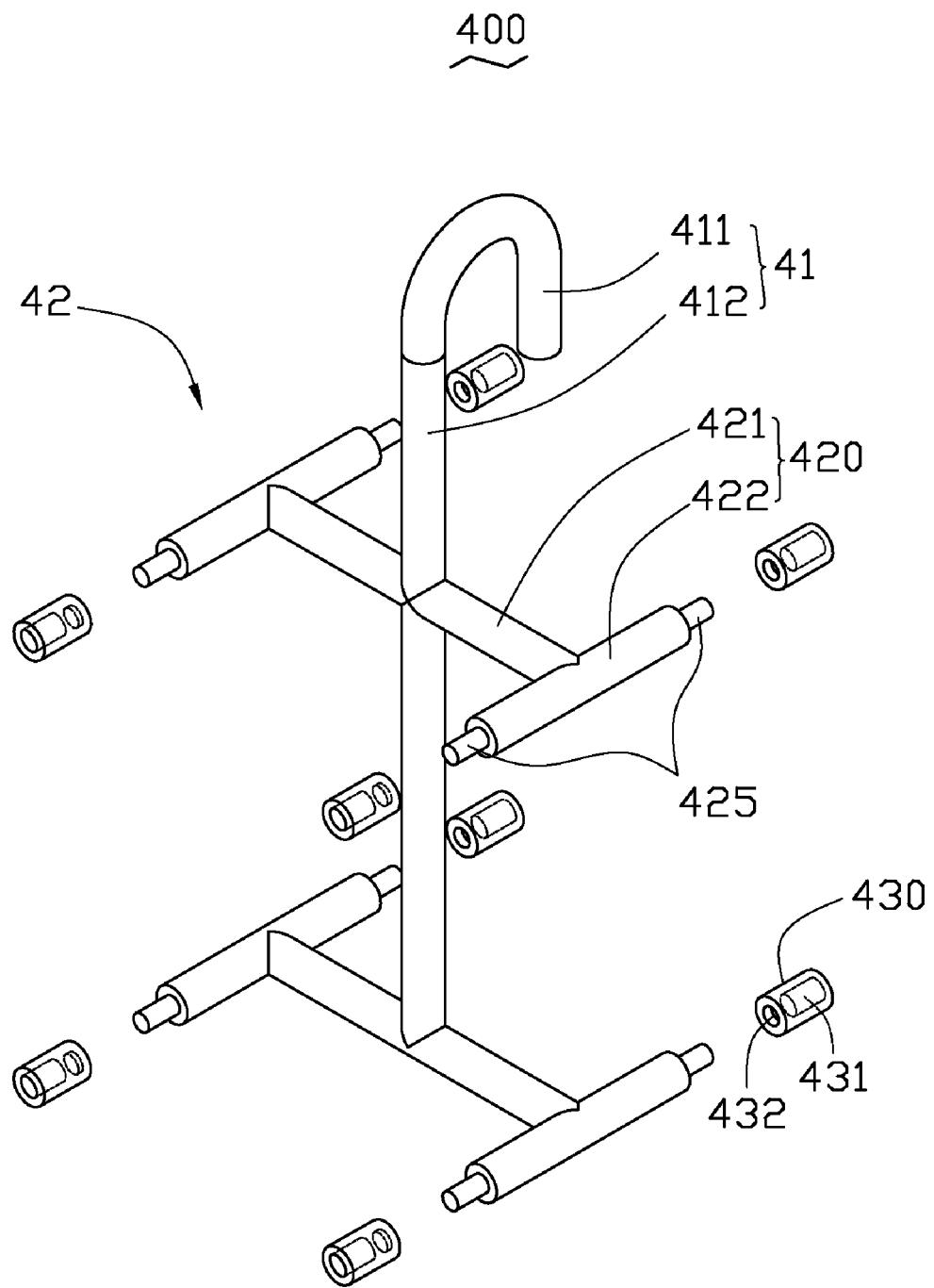
FIG. 8 is a schematic, exploded view of a holder in accordance with a fourth embodiment.

Referring to FIG. 8, a holder 400 for holding a flexible printed circuit board in accordance with a fourth embodiment includes a hanging member 41 and a magnetic assembly 42. The hanging member 41 includes a hook 411 and a stem 412. The magnetic assembly 42 includes two holding members 420 and eight securing members 430. Each holding member 420 includes an arm 421 and two holding units 422. Each arm 421 is fixed to the stem 412 of the hanging member 41. Preferably, the two arms 421 are parallel with each other. Two ends of the arm 421 are fixed to a middle portion of the two holding units 422 respectively. In other word, each holding units 422 extends from an end of the arm 421 toward two opposite directions. Two protrusions 425 are formed on two ends of each holding units 422. The protrusion 425 is cylinder shaped. Preferably, the four holding units 422 are parallel with each other.

Each securing member 430 includes a magnet 431 embedded therein. A groove 432 formed at an end of each securing member 430. The groove 432 is cylinder shaped. A diameter of the groove 432 is larger than that of the protrusion 425 thus the protrusion 425 can be received in the groove 432.

Figure 9:
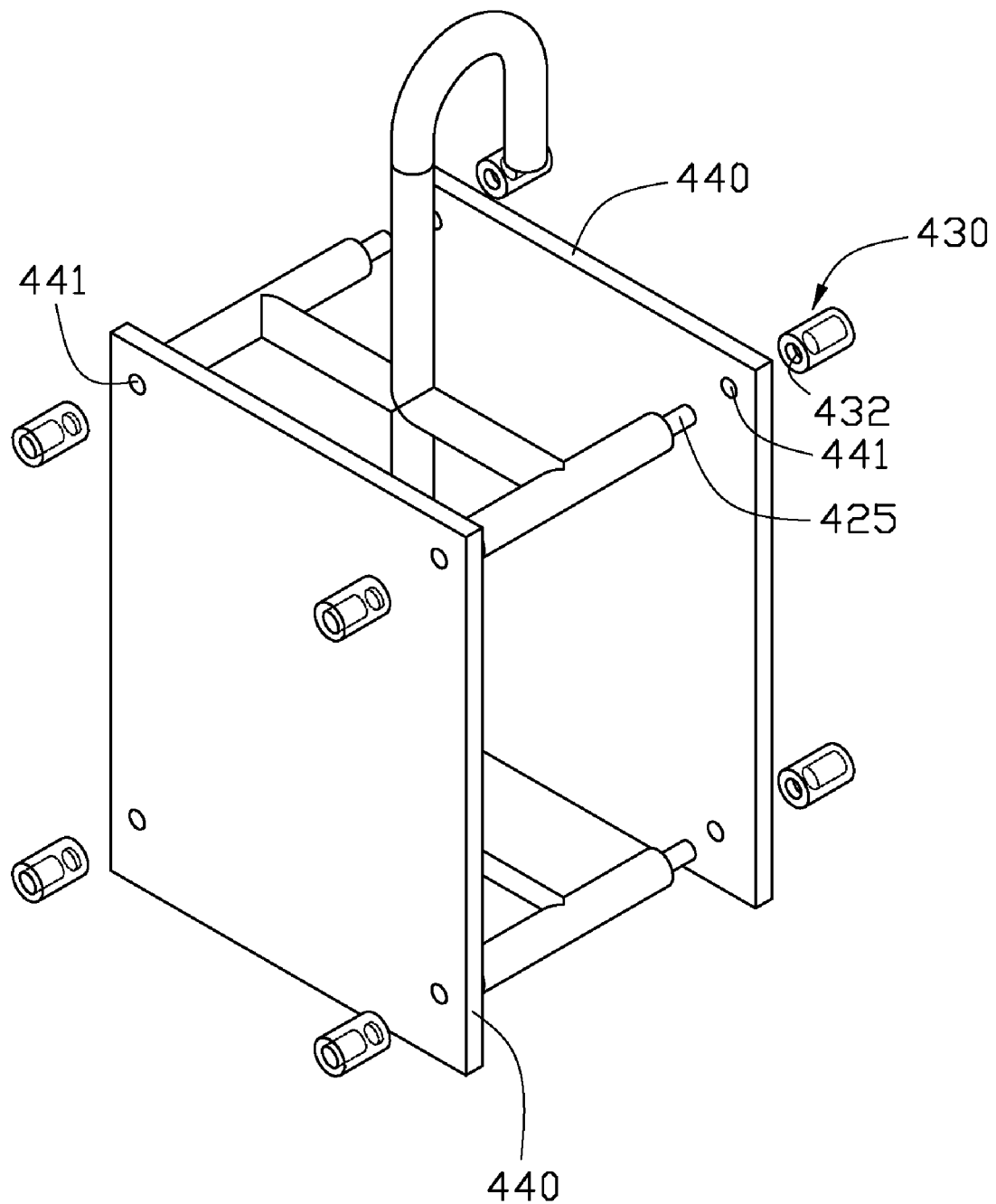
FIG. 9 is a schematic, exploded view of two flexible printed circuit boards and the holder of the FIG. 8.

Referring to FIG. 9, two flexible printed circuit boards 440 are provided. Each flexible printed circuit board 440 includes four securing holes 441 formed therein. Each securing hole 441 is aligned with a corresponding protrusion 425.

Figure 10:
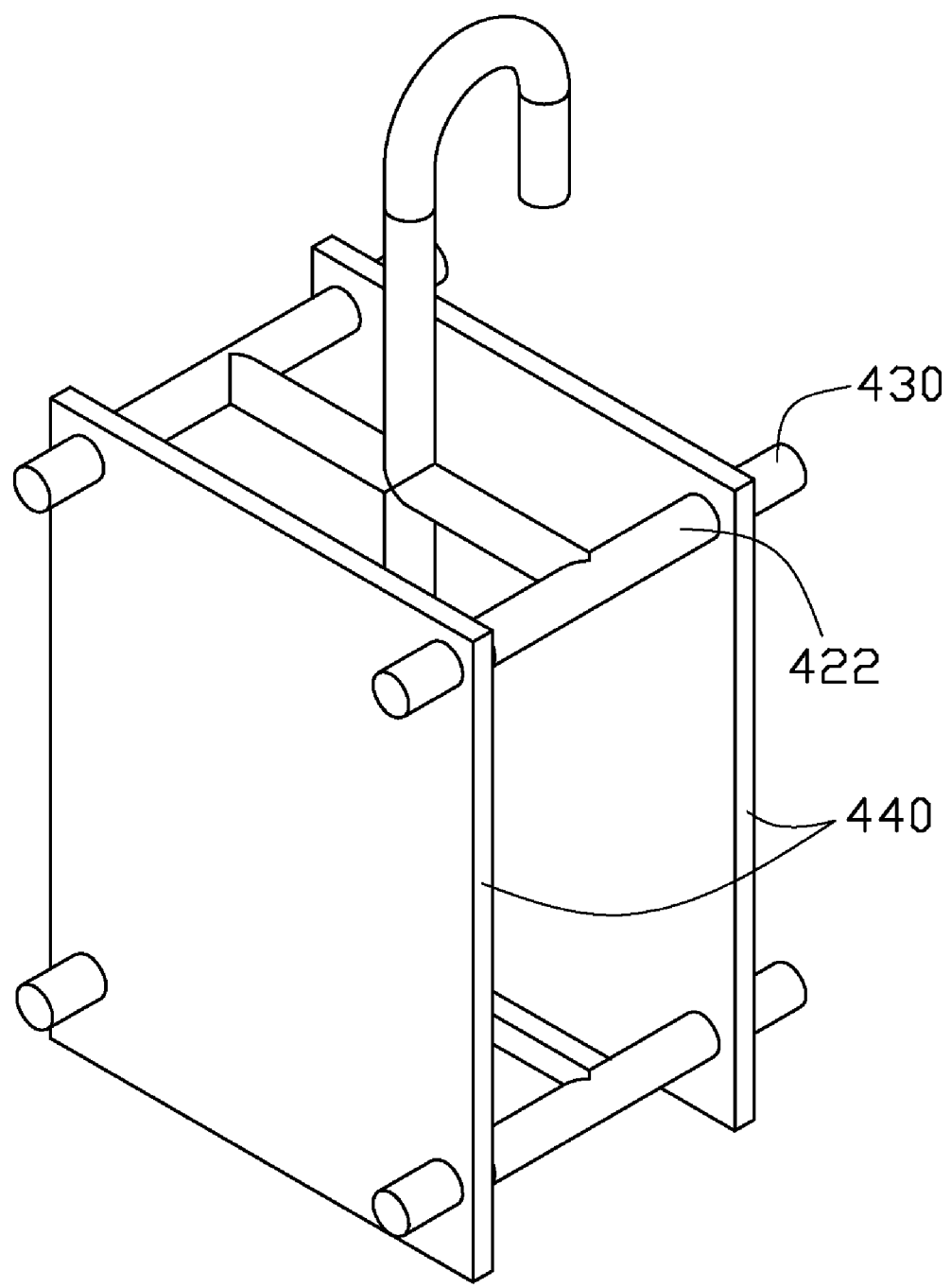
FIG. 10 is similar to FIG. 9, but shows the two flexible printed circuit boards being held by the holder of FIG. 8.

Referring to FIG. 10, each securing member 430 is magnetically attached to the holding unit 422 thus the two flexible printed circuit boards 440 are clamped between the securing member 430 and the holding units 422.

Finally, it is to be understood that the above-described embodiments are intended to illustrate rather than limit the invention. Variations may be made to the embodiments without departing from the spirit of the invention as claimed. The above-described embodiments illustrate the scope of the invention but do not restrict the scope of the invention.

What is claimed is:

1. A flexible printed circuit board holder for suspending a flexible printed circuit board, having a plurality of securing holes, the flexible printed circuit board holder comprising:
    a hook portion for hanging from a support bar, the hook portion having a stem; and
    a magnetic assembly including a holding member connected with the stem, the holding member having a plurality of protrusions for extension through the plurality of securing holes, and a plurality of securing members configured for magnetic attachment to the respective protrusions, thus removably securing the flexible printed circuit board to the magnetic assembly.

2. The flexible printed circuit board holder as claimed in claim 1, wherein a hole for receiving the corresponding protrusion is formed in an end of each securing member.

3. The flexible printed circuit board holder as claimed in claim 2, wherein the each securing member includes a magnet embedded therein.

4. The flexible printed circuit board holder as claimed in claim 1, wherein the plurality of protrusions are electrically conductive.

5. The flexible printed circuit board holder as claimed in claim 1, wherein the holding member has two arms connected to the stem and extend toward opposite directions.

6. The flexible printed circuit board holder as claimed in claim 5, wherein the two arms are parallel to each other, the holding member further comprises four holding units, two ends of each arm are respectively fixed to middle portion of two holding units, and two protrusions respectively protrude from two ends of each holding unit.

7. The flexible printed circuit board holder as claimed in claim 1, wherein the holding member is perpendicular to the stem of the hook portion.

8. The flexible printed circuit board holder as claimed in claim 1, wherein the magnetic assembly is comprised of a material selected from the group consisting of Nd—Fe—B magnetic materials, Sm—Co magnetic materials, AlNiCo magnetic materials, FeCrCo magnetic materials, $Fe_2O_3$, $BaFe_{12}O_{19}$ and $SrFe_{12}O_{19}$.

9. The flexible printed circuit board holder as claimed in claim 1, wherein the magnetic assembly is comprised of a material selected from the group consisting of iron, steel, cobalt, nickel, Fi—Si soft magnetic materials and Fe—Ni soft magnetic material.

* * * * *